United States Patent [19]

Taguchi et al.

[11] 4,182,962
[45] Jan. 8, 1980

[54] SEMICONDUCTOR TEMPERATURE COMPENSATION CIRCUIT

[75] Inventors: Shinichiro Taguchi, Fukaya; Tokio Aketagawa, Kumagaya, both of Japan

[73] Assignee: Tokyo Shibaura Electric Co., Ltd., Kawasaki, Japan

[21] Appl. No.: 841,581

[22] Filed: Oct. 12, 1977

[30] Foreign Application Priority Data

Oct. 16, 1976 [JP] Japan ................................ 51/123430

[51] Int. Cl.² ........................ H03K 17/60; H03K 5/08
[52] U.S. Cl. .................................. 307/254; 307/296 R; 307/310; 330/256
[58] Field of Search ............... 307/254, 296, 297, 310; 330/256, 255, 261, 266

[56] References Cited
U.S. PATENT DOCUMENTS 3,781,648  12/1973  Owens .............................. 307/297
3,970,947  7/1976  Sato et al. ......................... 330/361

*Primary Examiner*—Stanley D. Miller, Jr.
*Assistant Examiner*—B. P. Davis
*Attorney, Agent, or Firm*—Cushman, Darby & Cushman

[57] ABSTRACT

A semiconductor device which comprises a first current path formed of a first load, an n number of first transistors, each of whose bases is supplied with an input signal, a second transistor whose base is connected to a first bias power source, and an emitter resistor of said second transistor all connected in series between power supply terminals; and a second current path formed of a second load, a third transistor whose base is connected to a second bias power source through a base resistor, and an emitter resistor of the third transistor all connected in series between the power supply terminals, and wherein the resistance of the base resistor is chosen to be n times as large as that of the emitter resistor of the third transistor, thereby equalizing the amounts of current running through the first and second current paths.

5 Claims, 3 Drawing Figures

SEMICONDUCTOR TEMPERATURE COMPENSATION CIRCUIT

This invention relates to a semiconductor device which enables a stable bias current (voltage) to be supplied even when changes occur in the current amplification factor of a transistor in, for example, a bias circuit.

Figure 1:
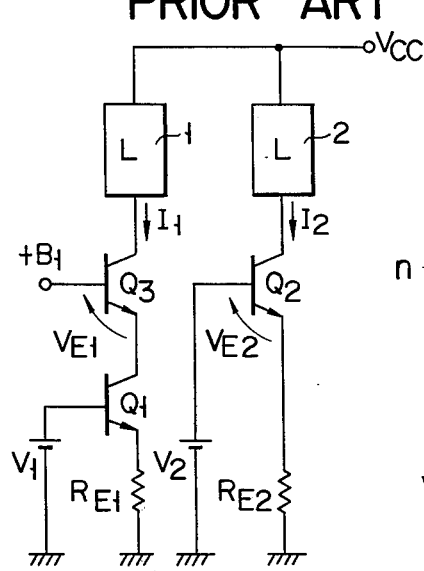

Generally, a transistor is used in varying the degree in which signals are amplified in, for example, an integrated circuit. Where a plurality of output currents (voltages) supplied from signal current (voltage) paths are handled, it is difficult to ensure the stable operation of the integrated circuit due to variations in the current amplification factor of transistors constituting the signal paths or loss of signals resulting from temperature changes. Particularly where different numbers of transistors constitute the respective signal paths, it is necessary to provide correction means in order to pass current bearing the prescribed ratio through the signal paths. FIG. 1 shows the prior art circuit which is not equipped with countermeasures against fluctuations in the properties of transistors used. With this prior art circuit, the base of a transistor $Q_1$ is connected to a bias power source $V_1$. The emitter of the transistor $Q_1$ is grounded through a resistor $R_{E1}$ and the collector thereof is connected to the emitter of a transistor $Q_3$ whose base is connected to a signal source (or power source) $+B_1$. The collector of the transistor $Q_3$ is connected to a load 1 for detecting current (voltage). The base of a transistor $Q_2$ is connected to a bias power source $V_2$. The emitter of said transistor $Q_2$ is grounded through a resistor $R_{E2}$, and the collector thereof is connected to a load 2 for detecting current (voltage).

There will now be described the operation of the prior art circuit arranged as described above. With $\beta$ taken to denote the current amplification factor of the transistors, then currents $I_1$, $I_2$ supplied to the load 1 and load 2 may be expressed by the following formulas:

$$I_1 = \frac{V_1 - V_{BE1}}{R_{E1}} \times (\frac{\beta}{1+\beta})^2 \qquad (1)$$

(where $V_{BE1}$ denotes voltage impressed across the base and emitter of the transistor $Q_1$)

$$I_2 = \frac{V_2 - V_{BE2}}{R_{E2}} \times (\frac{\beta}{1+\beta}) \qquad (2)$$

(where $V_{BE2}$ shows voltage impressed across the base and emitter of the transistor $Q_2$)

To simplify description, the assumption of $V_1 = V_2$, $V_{BE1} = V_{BE2}$ and $R_{E1} = R_{E2}$ is used. Where, in this case, the current amplification factor $\beta$ has a sufficiently large value, then the term $\beta/(1+\beta)$ has 1 approximately.

Namely, both currents $I_1$, $I_2$ have the same value. Where $\beta$ decreases in value, then the term $\beta/(1+\beta)$ has a smaller value than 1, causing the current $I_1$ to have a smaller value than the current $I_2$. Generally, the current amplification factor $\beta$ of a transistor varies from a relatively small value to a relatively large value, and particularly according to temperature changes. Since noncoincidence arises between a current amplification factor $\beta$ estimated when a circuit arrangement is designed and an amplification factor $\beta$ occurring during the actual operation of a circuit, a semiconductor device in practical use has an unstable property.

This invention has been accomplished in view of the above-mentioned circumstances and intended to provide a semiconductor device which always makes a stable operation regardless of changes in the current amplification factor of the transistors used.

Figure 2:
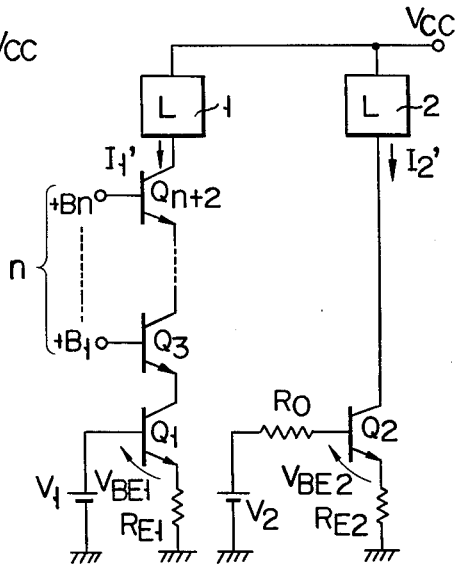
Figure 3:
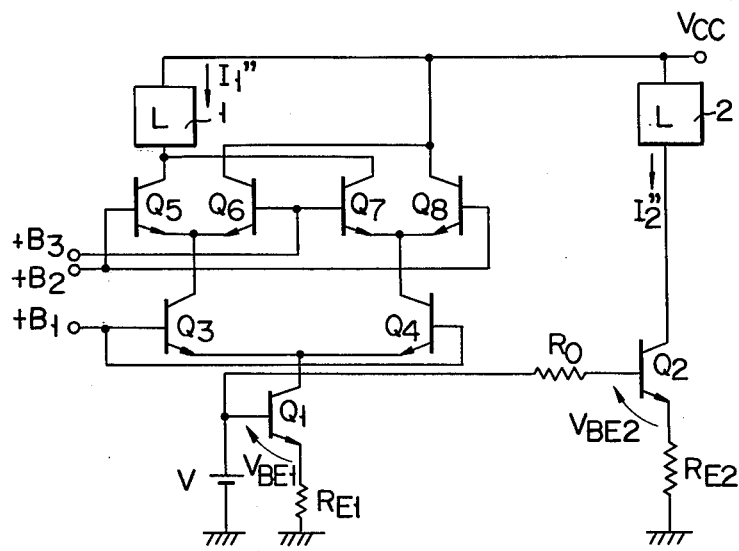

This invention can be more fully understood from the following detailed description when taken in conjunction with the accompanying drawing, in which:

FIG. 1 shows the circuit arrangement of a semiconductor device which is not equipped with countermeasures against variations in the property of a transistor; and FIGS. 2 and 3 show the circuit arrangements of semiconductor devices according to the preferred embodiments of this invention.

There will now be described by reference to FIG. 2 a semiconductor device according to one embodiment of this invention. The base of a transistor $Q_1$ is connected to a bias power source $V_1$ and the emitter thereof is grounded through an emitter resistor $R_{E1}$. The collector of said transistor $Q_1$ is connected to the emitter of a transistor $Q_3$ whose base is connected to a signal source (or power source) $+B_1$. The collector of the transistor $Q_3$ is connected to a load 1 for detecting current (voltage). With this embodiment, an n number of transistors are cascade-connected jointly to act as a signal inlet or bias power source. For comparison of the semiconductor device of this invention with that of the prior art, description is first given of one transistor. The base of a transistor $Q_2$ is connected to a signal source (or power source) through a resistor $R_0$. The emitter of said transistor $Q_2$ is grounded through a resistor $R_{E2}$, and the collector thereof is connected to a load 2 for detecting current (voltage). With $\beta$ taken to denote the current amplification factor of a transistor, then currents $I'_1$, $I'_2$ supplied to the load 1 and load 2 respectively may be expressed by the following formulas:

$$I'_1 = I_1 = \frac{V_1 - V_{BE1}}{R_{E1}} \times (\frac{\beta}{1+\beta})^2 \qquad (3)$$

(where the term $V_{BE1}$ denotes voltage impressed across the base and emitter of the transistor $Q_1$)

$$I'_2 = \frac{V_2 - V_{BE2}}{R_0}(1 - \frac{(1+\beta)R_{E2}}{R_0 + (1+\beta)R_{E2}} + \ldots) \times \beta \qquad (4)$$

(where the term $V_{BE2}$ shows voltage impressed across the base and emitter of the transistor $Q_2$)

The above formula (3) may be converted into:

$$I'_1 = \frac{V_1 - V_{BE1}}{R_{E1}}(1 - \frac{2}{1+\beta} + \frac{1}{(1+\beta)^2} - \ldots) \qquad (5)$$

Considering that the current amplification factor $\beta$ of a transistor in practical use has a minimum value of 20–40, the third term of the above formula (5) may be regarded to have a fully smaller value than those of the other terms. Therefore, the following formula results.

$$I'_1 = \frac{V_1 - V_{BE1}}{R_{E1}}(1 - \frac{2}{1+\beta}) \qquad (6)$$

Assuming that the currents $I'_1$, $I'_2$ flowing through the load 1 and load 2 are demanded to have the same value, the condition of establishing $I'_1 = I'_2$ may be determined from the formula (7) below:

$$\frac{V_1 - V_{BE1}}{R_{E1}} \left(1 - \frac{2}{1+\beta}\right) = \frac{V_2 - V_{BE2}}{R_{E2}} \left(1 - \frac{\frac{R_0}{R_{E2}} + 1}{\frac{R_0}{R_{E2}} + 1 + \beta}\right) \tag{7}$$

Assuming $V_1 = V_2$, $V_{BE1} = V_{BE2}$ and $R_{E1} = R_{E2}$ to simplify description, then the above formula (7) may be converted into:

$$\frac{2}{1+\beta} = \frac{\frac{R_0}{R_{E2}} + 1}{\frac{R_0}{R_{E2}} + 1 + \beta} \tag{8}$$

Further assuming that the following formula can be applied to the right side of the above formula (8):

$$\beta + 1 >> \frac{R_0}{R_{E2}} \tag{9}$$

then there results the following formula:

$$\frac{2}{1+\beta} = \frac{\frac{R_0}{R_{E2}} + 1}{1+\beta} \tag{10}$$

Thus, the condition of establishing $I'_1 = I'_2$ is found to be expressed by the formula:

$$\frac{R_0}{R_{E2}} = 1 \tag{11}$$

Where, with the foregoing embodiment, the resistor $R_0$ is designed to have substantially the same resistance as the resistor $R_{E2}$, then the currents $I'_1$, $I'_2$ can be made to have approximately the same value even when the current amplification factor of a transistor happens to decrease. Thus it has become possible to handle signals as desired by the use of said currents $I'_1$, $I'_2$.

There will now be described the case where an n number of transistors are cascade-connected in place of a single transistor $Q_3$.

The current $I'_1$ supplied to the load 1 has a value expressed by the following formula:

$$I'_1 = \frac{V_1 - V_{BE1}}{R_{E1}} \left(\frac{\beta}{1+\beta}\right)^{n+1} = \frac{V_1 - V_{BE1}}{R_{E1}} \left(1 - \frac{1}{1+\beta}\right)^{n+1} \tag{12}$$

Approximate formula represented by the first two terms of a formula developed from the above formula (12) may become the following.

$$I'_1 = \frac{V_1 - V_{BE1}}{R_{E1}} \left(1 - \frac{n+1}{1+\beta}\right) \tag{13}$$

Now assuming that the formula (13) and the formula (4) have the same value, and further where the formulas $V_1 = V_2$, $V_{BE1} = V_{BE2}$ and $R_{E1} = R_{E2}$ are supposed to be applicable, then calculation from the aforesaid approximation formula provides the formula:

$$R_0 = nR_{E2} \tag{14}$$

If, therefore, the resistor $R_0$ is designed to have a resistance n times as high as that of the resistor $R_{E2}$, then the currents $I'_1$, $I'_2$ can have the same value. It is seen therefore that a semiconductor device can make as stable an operation as in the previously described case, regardless of changes in the current amplification factor of the transistors involved. In the first embodiment, the ratio between the values of the currents $I'_1$, $I'_2$ was chosen to be 1. However, this invention is not limited thereto. If measures are taken, for example, to cause the emitter resistor $R_{E1}$ of the transistor $Q_1$ to have the prescribed resistance, then the currents $I'_1$, $I'_2$ will bear the prescribed ratio to each other, provided the formula (14) is satisfied.

There will now be described by reference to FIG. 3 a semiconductor device according to another embodiment of this invention. The base of a transistor $Q_1$ is connected to a bias power source V.

The emitter of said transistor $Q_1$ is grounded through a resistor $R_{E1}$. The collector of said transistor $Q_1$ is connected to a common emitter terminal of transistors $Q_3$, $Q_4$ of a differential amplifier whose bases are jointly connected to a bias power source (or signal source) $+B_1$. The collectors of said transistors $Q_3$, $Q_4$ are connected to the respective common emitters of two groups of transistors $Q_5$-$Q_6$ and $Q_7$-$Q_8$ which are included in a double balanced type differential amplifier. The bases of the transistors $Q_5$, $Q_8$ are connected to a bias power source (or signal source) $+B_2$. The bases of the transistors $Q_6$, $Q_7$ are connected to a bias power source (or signal source) $+B_3$. The common collector terminal of the transistors $Q_5$, $Q_7$ is connected to a load 1 for detecting current (voltage). The common collector terminal of the transistors $Q_6$, $Q_8$ is connected to a power source $V_{CC}$. The base of the transistor $Q_2$ is connected to the bias power source V through a resistor $R_0$. The emitter of said transistor $Q_2$ is grounded through a resistor $R_{E2}$, and the collector thereof is connected to a load 2 for detecting current (voltage).

There will now be described the operation of a semiconductor device according to the second embodiment whose circuit is arranged as described above. With $\beta$ taken to denote the current amplification factor of a transistor, the currents $I''_1$, $I''_2$ supplied to the loads 1, 2 respectively are expressed by the following formulas:

$$I''_1 = \frac{V - V_{BE1}}{R_{E1}} \cdot \frac{1}{2} \left(\frac{\beta}{1+\beta}\right)^3$$

$$I''_2 = \frac{V - V_{BE2}}{R_0} \left[1 - \frac{(1+\beta)\frac{R_{E2}}{R_0}}{1 + (1+\beta)\frac{R_{E2}}{R_0}}\right] \times \beta$$

Where the formulas $R_{E1} = \frac{1}{2}R_{E2}$ and $V_{BE1} = V_{BE2}$ are supposed to be applicable for simplification of description, and the same approximation calculation is made as in the aforesaid case, then it is advised to design the resistor $R_0$ to have a resistance about twice as high as that of the resistor $R_{E2}$. Then the currents $I''_1$, $I''_2$ will have the same value, even when the current simplification factor $\beta$ of a transistor decreases, thereby enabling a semiconductor device to make the same stable operation as when said amplification factor $\beta$ has a fully large value.

The fluctuating operation of a semiconductor device resulting from variations in the current amplification factor $\beta$ of a transistor gives rise to difficulties in integrating a plurality of transistors. This invention provides a semiconductor device well adapted for integration which can eliminate the above-mentioned difficulties by causing the ratio between the resistances of the prescribed resistors which is defined by a number of cascade-connected transistors to have the prescribed value.

What we claim is:

1. A compensating circuit comprising:
    a first signal path including:
        a first transistor having a base, a collector and an emitter, said emitter coupled to a first potential source, and said base coupled to a second potential source, said transistor establishing a first constant current through said collecter;
        n transistors cascade-coupled to said collector of said first transistor, said first constant current flowing through said cascade of transistors; and
        a first load coupled between said cascade of n transistors and a third potential source;
    a second signal path including;
        a second transistor having a base, a collector and an emitter, said emitter coupled to said first potential source through an emitter impedance and said base coupled to a fourth potential source through a base impedance, said transistor establishing a second constant current; and
        a second load coupled between said collector of said second transistor and said third potential source, said second constant current flowing therethrough, wherein the ratio between said base and emitter impedances of said second transistor is substantially equal to n.

2. A compensating circuit according to claim 1, wherein said emitter and base impedances of said second transistor are resistors, their resistance satisfy the following relationship:

$$\text{emitter resistance} = \frac{\text{base resistance}}{n}$$

3. A compensating circuit according to claim 1, wherein said emitter of said first transistor is coupled to said first potential source through an emitter impedance conducting said first constant current, said emitter impedance having a value selected such that said first and second constant currents have a predetermined ratio.

4. A compensating circuit according to claim 3, wherein each of said n cascaded transistors of said first signal path is part of a differential amplifier.

5. A compensating circuit comprising:
    a first signal path including:
        a first transistor having a base, an emitter, and a collector, said emitter coupled through a first emitter impedance to a first potential source, said base of said first transistor coupled to a bias source, said transistor establishing a first constant current;
        a first differential amplifier having emitters commonly coupled to said collector of said first transistor and having first and second collectors, said differential amplifier having bases coupled to a first common signal source;
        a double balanced differential amplifier including second and third differential amplifiers, said second differential amplifier having emitters commonly coupled to said first collector of said first differential amplifier and said third differential amplifier having emitters commonly coupled to said second collector of said first differential amplifier, said second and third differential amplifiers adapted to receive second and third input signals, each of said second and third differential amplifiers having first and second collectors; said second collectors coupled to a second potential source; and
        a first load coupling said second potential source to said first collectors of said second and third differential amplifiers; and
    a second signal path including;
        a second transistor having a base, an emitter and a collector, said emitter coupled through a second emitter impedance to said first potential source, and said base coupled through a base impedance to said bias source, said second transistor establishing a second constant current; and
        a second load coupling said collector of said second transistor to said second potential source, wherein the ratio of said base impedance to said second emitter impedance is substantially equal to n and wherein said second emitter impedance is essentially double that of said first emitter impedance.

* * * * *